(12) United States Patent  
Koyama

(10) Patent No.: US 7,566,909 B2  
(45) Date of Patent: Jul. 28, 2009

(54) SURFACE EMITTING TYPE DEVICE HAVING A RESISTANCE TO DAMAGE BY STATIC ELECTRICITY

(75) Inventor: Tomoko Koyama, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 535 days.

(21) Appl. No.: 11/342,641

(22) Filed: Jan. 31, 2006

(65) Prior Publication Data  
US 2006/0192088 A1 Aug. 31, 2006

(30) Foreign Application Priority Data  
Feb. 4, 2005 (JP) ............................. 2005-029233

(51) Int. Cl.  
*H01L 29/205* (2006.01)

(52) U.S. Cl. .................... 257/80; 257/81; 257/E27.004

(58) Field of Classification Search ............. 257/80–82, 257/E27.004, E33.076  
See application file for complete search history.

(56) References Cited

U.S. PATENT DOCUMENTS

| | | | | |
|---|---|---|---|---|
| 4,954,971 A | * | 9/1990 | Opschoor et al. | ........ 372/50.12 |
| 6,034,981 A | * | 3/2000 | Kim | ......................... 372/50.21 |
| 7,385,225 B2 | * | 6/2008 | Koyama | ....................... 257/79 |
| 2001/0032984 A1 | * | 10/2001 | Uchida | .......................... 257/84 |
| 2004/0119079 A1 | * | 6/2004 | Hayakawa et al. | ............ 257/80 |
| 2006/0175617 A1 | * | 8/2006 | Koyama | ....................... 257/79 |

FOREIGN PATENT DOCUMENTS

JP         A 2004-6548     1/2004

* cited by examiner

*Primary Examiner*—Allan R. Wilson  
(74) *Attorney, Agent, or Firm*—Oliff & Berridge, PLC

(57) ABSTRACT

A surface-emitting type device includes a rectification section including a substrate and a first semiconductor layer formed above the substrate, an emission section including a second semiconductor layer of a first conductivity type formed above the rectification section, an active layer formed above the second semiconductor layer and a third semiconductor layer of a second conductivity type formed above the active layer, and a photodetection section including the substrate, a photoabsorption layer formed above the substrate and a contact layer formed above the photoabsorption layer, wherein the first semiconductor layer and the contact layer are formed by a common process, the rectification section and the emission section are electrically connected in parallel with each other, and the rectification section has a rectification action in a reverse direction with respect to the emission section.

22 Claims, 7 Drawing Sheets

SURFACE EMITTING TYPE DEVICE HAVING A RESISTANCE TO DAMAGE BY STATIC ELECTRICITY The entire disclosure of Japanese Patent Application No. 2005-029233, filed Feb. 4, 2005 is expressly incorporated by reference herein.

BACKGROUND

1. Technical Field

The present invention relates to surface-emitting type devices and methods for manufacturing the same.

2. Related Art

A surface-emitting type semiconductor laser has a smaller device volume compared to an ordinary edge-emitting type semiconductor laser, such that the electrostatic breakdown voltage of the device itself is low. For this reason, the device may be damaged by static electricity caused by a machine or an operator in a mounting process. In particular, a surface-emitting type device such as a surface-emitting type semiconductor laser has a certain tolerance to a forward bias voltage, but has a low tolerance to a reverse bias voltage, and the device may be destroyed when a reverse bias voltage is impressed. A variety of measures are usually implemented in a mounting process to remove static electricity, but these measures have limitations. For example, JP-A-2004-6548 is an example of related art.

SUMMARY

In accordance with an advantage of some aspects of the invention, electrostatic destruction can be prevented and reliability can be improved with respect to surface-emitting type devices and methods for manufacturing the same.

In accordance with an embodiment of the invention, a surface-emitting type device has a rectification section including a substrate and a first semiconductor layer formed above the substrate, and an emission section including a second semiconductor layer of a first conductivity type formed above the surface, an active layer formed above the second semiconductor layer and a third semiconductor layer of a second conductivity type formed above the active layer, and a photodetection section including the substrate, a photoabsorption layer formed above the substrate and a contact layer formed above the photoabsorption layer, wherein the first semiconductor layer and the contact layer are formed by a common process, the rectification section and the emission section are electrically connected in parallel with each other, and the rectification section has a rectification action in a reverse direction with respect to the emission section.

According to the surface-emitting type device, even when a reverse bias voltage is impressed to the emission section, a current flows in the rectification section that is connected in parallel with the emission section. By this, the electrostatic breakdown voltage resistance of the surface-emitting type device to a reverse bias voltage can be considerably improved. Accordingly, destruction of the device by static electricity in a mounting process or the like can be prevented, such that its handling can be well facilitated, and its reliability can be improved.

It is noted that, in the embodiments of the invention, another specific element (hereafter referred to as "B") that is formed above a specific element (hereafter referred to as "A"), includes B that is formed directly on A, and B that is formed above A through another element on A. Also, in the invention, forming B above A includes a case of forming B directly on A, and a case of forming B above A through another element on A.

Also, in the embodiments of the invention, a "photoabsorption layer" refers to a concept including a depletion layer.

In accordance with an aspect of the embodiment, the surface-emitting type device may include a substrate connecting electrode that is electrically connected to the substrate, and first, second and third electrodes that are electrically connected to the first, second and third semiconductor layers, respectively, wherein the substrate may have a first conductivity type, the first semiconductor layer may have a second conductivity type, the substrate connecting electrode may be electrically connected to the third electrode, and the first electrode may be electrically connected to the second electrode.

In the surface-emitting type device in accordance with an aspect of the embodiment, the rectification section may have a fourth semiconductor layer formed between the substrate and the first semiconductor layer, and the photodetection section may include a second contact layer formed between the substrate and the photoabsorption layer, wherein the fourth semiconductor layer and the second contact layer may be formed by a common process.

In accordance with an aspect of the embodiment, the surface-emitting type device may have first, second, third and fourth electrodes that are electrically connected to the first, second, third and fourth semiconductor layers, respectively, wherein the first semiconductor layer may have a second conductivity type, the fourth semiconductor layer may have a first conductivity type, the first electrode may be electrically connected to the second electrode, and the third electrode may be electrically connected to the fourth electrode.

In the surface-emitting type device in accordance with an aspect of the embodiment, the emission section may be formed vertically above at least a portion of the photodetection section.

In accordance with an aspect of the embodiment, the surface-emitting type device may have another photodetection section including the substrate, another photoabsorption layer formed above the substrate, and another contact layer formed above the other photoabsorption layer, wherein the photoabsorption layer and the other photoabsorption layer may be formed by a common process, and the contact layer and the other contact layer may be formed by a common process.

In accordance with an aspect of the embodiment, the surface-emitting type device may have a support section formed above the substrate, the support section including a first support layer, a second support layer formed above the first support layer, and a third support layer formed above the second support layer, wherein the first support layer and the second semiconductor layer may be formed by a common process, the second support layer and the active layer may be formed by a common process, the third support layer and the third semiconductor layer may be formed by a common process, the other photodetection section may be formed immediately above at least a portion of the support section, and the rectification section and the photodetection section may be formed immediately above at least a portion of the emission section.

In the surface-emitting type device in accordance with an aspect of the embodiment, a capacitance adjusting layer may be formed between the substrate and the first semiconductor layer, wherein the capacitance adjusting layer and the photoabsorption layer may be formed by a common process.

In the surface-emitting type device in accordance with an aspect of the embodiment, the emission section may function as a surface-emitting type semiconductor laser, the second semiconductor layer and the third semiconductor layer may be mirrors, and the photodetection section may function as a photodiode for monitoring the surface-emitting type semiconductor laser.

In the surface-emitting type device in accordance with an aspect of the embodiment, the emission section may function as a surface-emitting type semiconductor laser, the second semiconductor layer and the third semiconductor layer may be mirrors, and the photodetection section may function as a photodiode for reception in two-way communications.

In accordance with an embodiment of the invention, a method for manufacturing a surface-emitting type device includes the steps of forming a semiconductor multilayer film, including forming a first semiconductor layer and a contact layer above a substrate, forming a second semiconductor layer of a first conductivity type above the substrate, forming an active layer above the second semiconductor layer, and forming a third semiconductor layer of a second conductivity type above the active layer, and patterning the semiconductor multilayer film to form a rectification section including the substrate and the first semiconductor layer, an emission section including the second semiconductor layer, the active layer and the third semiconductor layer, and a photodetection section including the substrate, the photoabsorption layer and the contact layer, wherein the rectification section and the emission section are arranged to be electrically connected in parallel with each other, and the rectification section is formed to have a rectification action in a reverse direction with respect to the emission section.

According to the method for manufacturing the surface-emitting type device, the contact layer and the first semiconductor layer can be formed by a common process. Accordingly, when the rectification section, the emission section and the photodetection section are formed on a common substrate, the manufacturing process can be simplified.

In the method for manufacturing a surface-emitting type device in accordance with an aspect of the embodiment of the invention, the step of forming the semiconductor multilayer film may include forming a fourth semiconductor layer and a second contact layer above the substrate before the step of forming the first semiconductor layer and the contact layer, and the step of patterning the semiconductor multilayer film may be conducted to form the rectification section that has the fourth semiconductor layer, and conducted to form the photodetection section having the second contact layer.

In the method for forming a surface-emitting type device in accordance with an aspect of the embodiment, the emission section may be formed vertically above at least a portion of the photodetection section.

In the method for manufacturing a surface-emitting type device in accordance with an aspect of the embodiment of the invention, the step of forming the semiconductor multilayer film may include forming another photoabsorption layer by a common process that forms the photoabsorption layer, and forming another contact layer by a common process that forms the contact layer, and the step of patterning the semiconductor multilayer film may be conducted to form another photodetection section including the substrate, the other photoabsorption layer and the other contact layer.

In the method for manufacturing a surface-emitting type device in accordance with an aspect of the embodiment of the invention, the step of forming the semiconductor multilayer film may include forming a first support layer by a common process conducted for the second semiconductor layer, forming a second support layer by a common process conducted for the active layer, and forming a third support layer by a common process conducted for the third semiconductor layer, and the step of patterning the semiconductor multilayer film may be conducted to form a support section including the first support layer, the second support layer and the third support layer, the other photodetection section may be formed vertically above at least a portion of the support section, and the rectification section and the photodetection section may be formed vertically above at least a portion of the emission section.

DESCRIPTION OF EXEMPLARY EMBODIMENTS

Preferred embodiments of the invention are described below with reference to the accompanying drawings.

1. First Embodiment 1-1. First, a surface-emitting type device 100 in accordance with a first embodiment is described.

Figure 1:
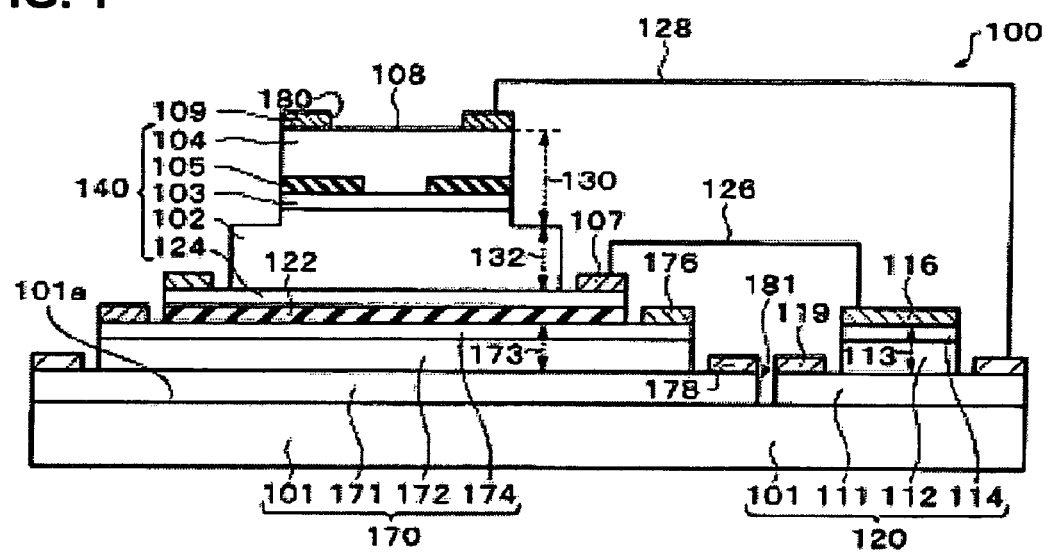
FIG. 1 is a cross-sectional view schematically showing a surface-emitting type device in accordance with a first embodiment of the invention.
Figure 2:
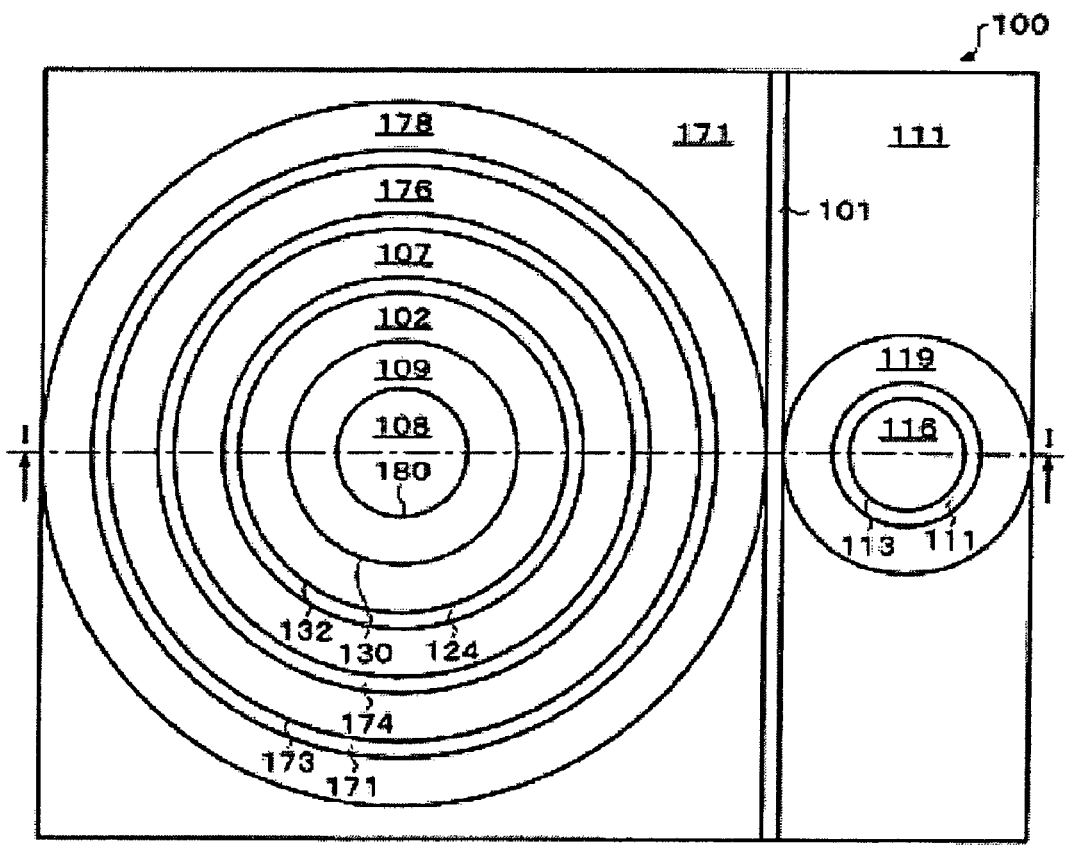
FIG. 2 is a plan view schematically showing the surface-emitting type device in accordance with the first embodiment of the invention.
Figure 3:
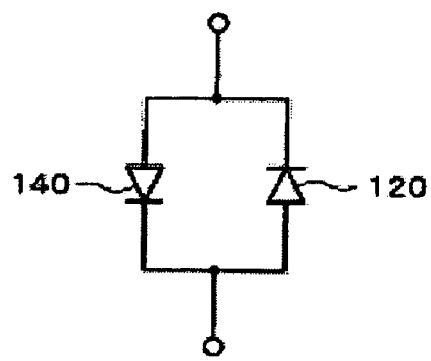
FIG. 3 is a circuit diagram of a main section of the surface-emitting type device in accordance with the first embodiment.

FIG. 1 is a cross-sectional view taken along a line I-I of FIG. 2, and FIG. 2 is a plan view schematically showing the surface-emitting type device 100. FIG. 3 is a circuit diagram of a main portion of the surface-emitting type device 100.

The surface-emitting type device 100 includes, as shown in FIG. 1 and FIG. 2, a rectification section 120, an emission section 140 and a photodetector section 170. The present embodiment is described as to a case in which the rectification section 120 functions as a junction diode (including a Zener diode), the emission section 140 functions as a surface-emitting type semiconductor laser, and the photodetector section 170 functions as a photodiode.

The rectification section 120 includes a substrate 101, a fourth semiconductor layer 111 formed above the substrate 101, a capacitance adjusting layer 112 formed above the forth semiconductor layer 111, and a first semiconductor layer 114 formed above the capacitance adjusting layer 112. The rectification section 120 has a rectification function. For example, a semi-insulating GaAs substrate can be used as the substrate 101. The substrate 101 supports the rectification section 120, the emission section 140 and the photodetector section 170. In other words, the rectification section 120, the emission section 140 and the photodetector section 170 are formed on a common substrate (on the same chip), and form a monolithic structure.

The fourth semiconductor layer 111 may be formed from, for example, a GaAs layer of a first conductivity type (for example, n-type), the capacitance adjusting layer 112 may be formed from, for example, a GaAs layer that is not doped with an impurity, and the first semiconductor layer 114 may be formed from, for example, a GaAs layer of a second conductivity type (for example, p-type). Accordingly, the p-type first semiconductor layer 114, the capacitance adjusting layer 112 that is not doped with an impurity and the n-type fourth semiconductor layer 111 form a pin diode.

The capacitance adjusting layer 112 and the first semiconductor layer 114 form a columnar semiconductor deposited body (hereafter referred to as a "third columnar section") 113. The third columnar section 113 may have a plane configuration that is, for example, a circular shape.

A fourth electrode 119 is electrically connected to the fourth semiconductor layer 111, and the first electrode 116 is electrically connected to the first semiconductor layer 114. For example, the fourth electrode 119 is formed on the fourth semiconductor layer 111. The fourth electrode 119 has a plane configuration that is, for example, a circular shape, as shown in FIG. 2. For example, the first electrode 116 is formed over the entire top surface of the first semiconductor layer 114. The first electrode 116 has a plane configuration that is, for example, a ring shape, as shown in FIG. 2. The fourth electrode 119 and the first electrode 116 are used to drive the rectification section 120.

As shown in FIG. 1 and FIG. 2, the emission section 140 and the photodetector section 170 are formed to the side of the rectification section 120. An element isolation region 181 is formed between the rectification section 120, the emission section 140 and the photodetector section 170. More concretely, the element isolation region 181 may be a groove formed by, for example, a side wall of the fourth semiconductor layer 111, a top surface of the substrate 101 and a side surface of the second contact layer 171. In other words, the groove may be dug at least to a depth that exposes the top surface of the substrate. In this case, by using an insulating or semi-insulating substrate as the substrate 101, the rectification section 120, the emission section 140 and the photodetector section 170 can be securely, electrically isolated from one another. The element isolation region 181 has a plane configuration that is, for example, a linear shape. Also, the fourth semiconductor layer 111 and the second contact layer 171 may be formed over the entire top surface of the substrate 101 except the element isolation region 181.

The photodetector section 170 includes the substrate 101, a second contact layer 171 formed above the substrate 101, a photoabsorption layer 172 formed above the second contact layer 171, and a first contact layer 174 formed above the photoabsorption layer 172. The second contact layer 171 is formed by the same process conducted for forming the fourth semiconductor layer 111, the photoabsorption layer 172 is formed by the same process conducted for forming the capacitance adjusting layer 112, and the first contact layer 174 is formed by the same process conducted for forming the first semiconductor layer 114. In other words, the second contact layer 171 is composed of semiconductor with the same composition as that of the fourth semiconductor layer 111, the photoabsorption layer 172 is composed of semiconductor with the same composition as that of the capacitance adjusting layer 112, and the first contact layer 174 is composed of semiconductor with the same composition as that of the first semiconductor layer 114. Furthermore, the distance between the substrate 101 and the photoabsorption layer 172 is about the same as the distance between the substrate 101 and the capacitance adjusting layer 112, and the distance between the substrate 101 and the first contact layer 174 is about the same as the distance between the substrate 101 and the first semiconductor layer 114.

More concretely, the second contact layer 171 may be formed from, for example, a GaAs layer of a first conductivity type (for example, n-type), the photoabsorption layer 172 may be formed from, for example, a GaAs layer that is not doped with an impurity, and the first contact layer 174 may be formed from, for example, a GaAs layer of a second conductivity type (for example, p-type). Accordingly, the p-type first contact layer 174, the photoabsorption layer 172 that is not doped with an impurity and the n-type second contact layer 171 form a pin diode.

The first contact layer 174 and the photoabsorption layer 172 form a columnar semiconductor deposited body (hereafter referred to as a "fourth columnar section") 173. The fourth columnar section 173 has a plane configuration that is, for example, a circular shape.

A fifth electrode 176 is electrically connected to the first contact layer 174, and a sixth electrode 178 is electrically connected to the second contact layer 171. For example, the fifth electrode 176 is formed on the first contact layer 174 along its circumference. The fifth electrode 176 has a plane configuration that is, for example, a ring shape shown in FIG. 2. For example, the sixth electrode 178 is formed on the second contact layer 171. The sixth electrode 178 has a plane configuration that is, for example, a ring shape shown in FIG. 2. The fifth and sixth electrodes 176 and 178 are used to drive the photodetector section 170.

An isolation layer 122 is formed on the photodetector section 170. The isolation layer 122 is provided between the photodetector section 170 and the emission section 140. More concretely, as shown in FIG. 1, the isolation layer 122 is provided between the first contact layer 174 and a third contact layer 124 to be described below. The photodetector section 170 and the third contact layer 124 can be electrically isolated from each other by the isolation layer 122. As the isolation layer 122, for example, an $Al_{0.9}Ga_{0.1}As$ layer that is not doped with an impurity or the like can be used. It is noted that the fifth electrode 176 is formed on the first contact layer 174 in a region where the isolation layer 122 is not formed. Alternatively, although not illustrated, the third contact layer 124 may be formed directly on the first semiconductor layer 114 without forming the isolation layer 122, thereby electrically connecting the fifth electrode 176 and a second electrode 107 to be described below.

The emission section 140 is formed on the isolation layer 122. Also, the emission section 140 is formed vertically above at least a portion of the photodetector section 170. In other words, in a plan view, the outer circumference of a lowermost layer (the third contact layer 124 in the present embodiment) among the emission section 140 is located inside (or coincides with) the outer circumference of an uppermost layer (the first contact layer 174 in the present embodiment) among the photodetector section 170. The emission section 140 includes the third contact layer 124 of a first conductivity type (for example, n-type), a second semiconductor layer 102 of the first conductivity type formed on the third contact layer 124, an active layer 103 formed on the second semiconductor layer 102, and a third semiconductor layer 104 of a second conductivity type (for example, p-type) formed on the active layer 103. More concretely, the third contact layer 124 is, for example, an n-type GaAs layer. The second semiconductor layer 102 is, for example, a distributed Bragg reflection type (DBR) mirror of 40 pairs of alternately laminated n-type $Al_{0.9}Ga_{0.1}As$ layers and n-type $Al_{0.15}Ga_{0.85}As$ layers. The active layer 103 has a multiple quantum well (MQW) structure in which quantum well structures each formed from, for example, a GaAs well layer and an $Al_{0.3}Ga_{0.7}As$ barrier layer are laminated in three layers. The third semiconductor layer 104 is, for example, a DBR mirror of 25 pairs of alternately laminated p-type $Al_{0.9}Ga_{0.1}As$ layers and p-type $Al_{0.15}Ga_{0.85}As$ layers. It is noted that the uppermost layer of the third semiconductor layer 104 may be a contact layer composed of, for example, a p-type GaAs layer. The composition of each of the layers and the number of the layers composing the second semiconductor layer 102, the active layer 103 and the third semiconductor layer 104 are not particularly limited. The p-type third semiconductor layer 104, the active layer 103 that is not doped with an impurity and the n-type second semiconductor layer 102 form a pin diode.

The third contact layer 124 and the isolation layer 122 described above form a columnar semiconductor deposited body. The columnar semiconductor deposited body has a plane configuration that is, for example, a circular shape. Also, a portion of the emission section 140 extending from the third semiconductor layer 104 to a certain point of the second semiconductor layer 102 composes a columnar semiconductor deposited body (hereafter referred to as a "first columnar section") 130, the remaining portion of the second semiconductor layer 102 composes another columnar semiconductor deposited body (hereafter referred to as a "second columnar section") 132. The first columnar section 130 has a plane configuration that is, for example, a circular shape shown in FIG. 2. The second columnar section 132 has a plane configuration that is, for example, a circular shape with a diameter greater than that of the circular shape of the first columnar section 130.

Also, the emission section 140 has an oxidized constricting layer 105. The oxidized constricting layer 105 may be, for example, one of the layers composing the third semiconductor layer 104. The oxidized constricting layer 105 is formed in a region near the active layer 103. As the oxidized constricting layer 105, for example, an oxidized AlGaAs layer can be used. The oxidized constricting layer 105 is a dielectric layer having an opening section. The oxidized constricting layer 105 is formed in a ring shape. More concretely, the oxidized constricting layer 105 is formed such that its cross-sectional shape, as being cut in a plane parallel with a surface 101a of the substrate 101 shown in FIG. 1, is a ring shape that is concentric with the circular shape of the plane configuration of the first columnar section 130.

A second electrode 107 is formed on an upper surface of the third contact layer 124. The second electrode 107 has a plane configuration that is, for example, a ring shape shown in FIG. 2. The second electrode 107 is electrically connected to the third contact layer 124. A third electrode 109 is formed on the first columnar section 130. The third electrode 109 has a plane configuration that is, for example, a ring shape shown in FIG. 2. The third electrode 109 is electrically connected to the third semiconductor layer 104. The third electrode 109 has an opening section 180 over the first columnar section 130. In other words, the opening section 180 forms a region in the upper surface of the third semiconductor layer 104 where the third electrode 109 is not provided. This region defines an emission surface 108 of laser light. The shape of the emission surface 108 may be, for example, a circular shape shown in FIG. 2.

In the surface-emitting type device 100 shown in FIG. 1 and FIG. 2, the second electrode 107 connects to the second semiconductor layer 102 through the third contact layer 124, and the third electrode 109 connects to the third semiconductor layer 104 on the first columnar section 130. A current is injected in the active layer 103 by the second electrode 107 and the third electrode 109.

The rectification section 120 and the emission section 140 are electrically connected in parallel with each other, as shown in a circuit diagram in FIG. 3, and the rectification section 120 has a rectification function in a reverse direction with respect to the emission section 140. As a concrete connection configuration, for example, the first electrode 116 and the second electrode 107 may be electrically connected with each other by a first wiring 126, and the third electrode 109 and the fourth electrode 119 may be electrically connected with each other by a second wiring 128. It is noted that the illustration of the first and second wirings 126 and 128 is simplified in FIG. 1, and omitted in FIG. 2.

When the emission section 140 is driven, a forward bias voltage is impressed to the emission section 140, and a reverse bias voltage is impressed to the rectification section 120. In this instance, the breakdown voltage of the rectification section 120 may be preferably greater than the drive voltage of the emission section 140, so as to flow a current only in the emission section 140. By this, even when a forward bias voltage is impressed to the emission section 140, no (or almost no) reverse current flows in the rectification section 120, such that the emission operation normally takes place at the emission section 140.

It is noted here that the breakdown voltage of the rectification section 120 can be optionally controlled by, for example, adjusting the composition, impurity concentration and the like of the first semiconductor layer 114 and the fourth semiconductor layer 111. For example, by reducing the impurity concentration of the first semiconductor layer 114 and the fourth semiconductor layer 111, the breakdown voltage of the rectification section 120 can be increased. The first semiconductor layer 114 and the fourth semiconductor layer 111 are formed independently of semiconductor layers that contribute to the light emission action of the emission section 140. For this reason, the composition, impurity concentration and the like of the first semiconductor layer 114 and the fourth semiconductor layer 111 can be freely adjusted. Accordingly, the rectification section 120 can be readily formed with more ideal characteristics, electrostatic destruction can be effectively prevented, and more stable emission operation can be achieved.

Alternatively, by adjusting the composition, impurity concentration and the like of the second and third semiconductor layers 102 and 104 of the emission section 140, the drive voltage of the emission section 140 can be made smaller than the breakdown voltage of the rectification section 120.

Also, by changing the film thickness of the capacitance adjusting layer 112, the capacitance of the rectification section 120 can be optionally changed and set to a desired value. For example, by reducing the film thickness of the capacitance adjusting layer 112, the capacitance of the rectification section 120 can be increased, and further, the breakdown voltage of the rectification section 120 can be increased.

It is noted that the invention is not limited to the case where the emission section 140 is a surface-emitting type semiconductor laser, but is also applicable to other surface-emitting type devices (such as, for example, semiconductor emission diodes, and organic LEDs). Also, the invention is not limited to the case where the rectification section 120 is a junction diode, but is also applicable to other rectification elements (such as, for example, Schottky diodes).

Also, the present embodiment is described as to the case where the photodetector section 170 functions as a pin type photodiode, but the embodiment is also applicable to photodetecting elements other than the pin type photodiode. It is noted that photodetecting elements to which the invention is applicable include pn-type photodiodes, avalanche type photodiodes, MSM type photodiodes and the like. This similarly applies to first and second photodetector sections 170 and 190 in accordance with a second embodiment to be described below.

Figure 4:
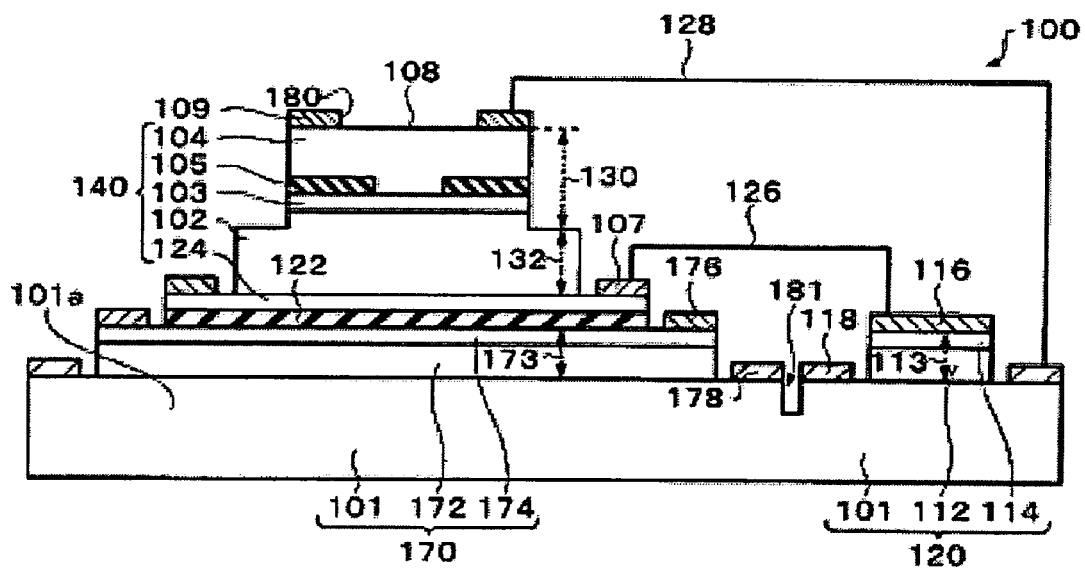
FIG. 4 is a cross-sectional view schematically showing the surface-emitting type device in accordance with the first embodiment.

Also, the present embodiment is described as to the case where the fourth semiconductor layer 111 and the second contact layer 171 are formed. However, for example, as shown in FIG. 4, it is possible to provide a surface-emitting type device without forming the fourth semiconductor layer 111 and the second contact layer 171. FIG. 4 is a schematic cross-sectional view of a surface-emitting type device 100 in such a case, which corresponds to the cross-sectional view of FIG. 1. In this case, for example, a GaAs substrate of a first conductivity type (for example, n-type) may be used as the substrate 101, and a groove, for example, may be dug in the substrate 101 to thereby define an element isolation region 181. A substrate connecting electrode 118 is electrically connected to the substrate 101. As a concrete connection configuration, for example, the first electrode 116 and the second electrode 107 may be electrically connected with each other by a first wiring 126, and the third electrode 109 and the substrate connecting electrode 118 may be electrically connected with each other by a second wiring 128.

Figure 5:
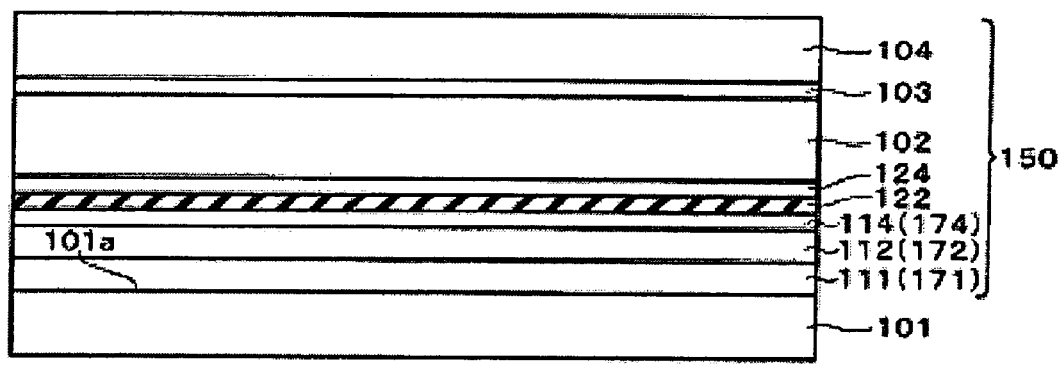
FIG. 5 is a cross-sectional view schematically showing a method for manufacturing the surface-emitting type device in accordance with the first embodiment.
Figure 6:
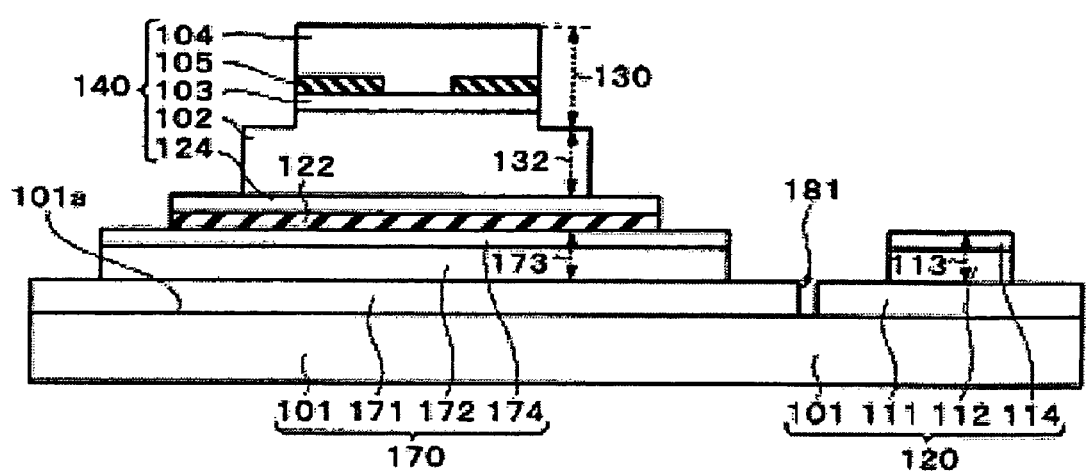
FIG. 6 is a cross-sectional view schematically showing the method for manufacturing the surface-emitting type device in accordance with the first embodiment.

1-2. Next, an example of a method for manufacturing the surface-emitting type device 100 in accordance with the present embodiment is described with reference to FIG. 1, FIG. 2, FIG. 5 and FIG. 6. FIG. 5 and FIG. 6 are cross-sectional views schematically showing a process for manufacturing the surface-emitting type device 100 in accordance with the present embodiment shown in FIG. 1 and FIG. 2, and correspond to the cross-sectional view shown in FIG. 1, respectively.

(1) First, as shown in FIG. 5, for example, a semi-insulating GaAs substrate is prepared as a substrate 101.

Next, a semiconductor multilayer film 150 is formed on the substrate 101 by epitaxial growth while modifying its composition. The semiconductor multilayer film 150 is composed of successively laminated semiconductor layers that compose a fourth semiconductor layer 111 (second contact layer 171), a capacitance adjusting layer 112 (photoabsorption layer 172), a first semiconductor layer 114 (first contact layer 174), an isolation layer 122, a third contact layer 124, a second semiconductor layer 102, an active layer 103, and a third semiconductor layer 104. It is noted here that the semiconductor layer composing the fourth semiconductor layer 111 is the semiconductor layer composing the second contact layer 171, the semiconductor layer composing the capacitance adjusting layer 112 is the semiconductor layer composing the photoabsorption layer 172, and the semiconductor layer composing the first semiconductor layer 114 is the semiconductor layer composing the first contact layer 174.

It is noted that, when the third semiconductor layer 104 is grown, at least one layer thereof near the active layer 103 is formed to be a layer that is later oxidized and becomes an oxidized constricting layer 105. As the layer that becomes to be the oxidized constricting layer 105, an AlGaAs layer with its Al composition being 0.95 or greater can be used. The Al composition of the AlGaAs layer means an aluminum composition with respect to III-group elements.

(2) Next, as shown in FIG. 6, the semiconductor multilayer film 150 is patterned to form the fourth semiconductor layer 111 and the second contact layer 171, the capacitance adjusting layer 112 and the photoabsorption layer 172, the first semiconductor layer 114 and the first contact layer 174, the isolation layer 122, the third contact layer 124, the second semiconductor layer 102, the active layer 103, and the third semiconductor layer 104 in desired configurations. It is noted here that the fourth semiconductor layer 111 and the second contact layer 171 can be formed by the same patterning step, the capacitance adjusting layer 112 and the photoabsorption layer 172 can be formed by the same patterning step, and the first semiconductor layer 114 and the first contact layer 174 can be formed by the same patterning step. Also, when the fourth semiconductor layer 111 and the second contact layer 171 are formed, the element isolation region 181 can be formed between them. By these patterning steps, first through fourth columnar sections 130, 132, 113 and 173 are formed. The semiconductor multilayer film 150 can be patterned by known lithography technique and etching technique.

Next, by placing the substrate 101 on which the first through fourth columnar sections 130, 132, 113 and 173 are formed through the aforementioned steps in a water vapor atmosphere at about 400° C., for example, the above-described layer that becomes to be an oxidized constricting layer 105 is oxidized from its side surface, thereby forming the oxidized constricting layer 105, as shown in FIG. 6. When the emission section 140 having the oxidized constricting layer 105 is driven, electrical current flows only in a portion where the oxidized constricting layer 105 is not formed (a portion that is not oxidized). Accordingly, in the step for forming the oxidized constricting layer 105, the range of the oxidized constricting layer 105 to be formed may be controlled, whereby the current density can be controlled.

(3) Next, as shown in FIG. 1 and FIG. 2, first-sixth electrodes 116, 107, 109, 119, 176 and 178, and first and second wirings 126 and 128 are formed. These electrodes and wirings may be formed by, for example, a vacuum vapor deposition method and a lift-off method combined. As the first electrode 116, the third electrode 109, and the fifth electrode 176, for example, a laminated film of gold (Au) and an alloy of gold (Au) and zinc (Zn) can be used. As the second electrode 107, the fourth electrode 119 and the sixth electrode 178, for example, a laminated film of an alloy of gold (Au) and germanium (Ge), nickel (Ni) and gold (Au) can be used. As the first and second wirings 126 and 128, for example, gold (Au) can be used. It is noted that the order to form the electrodes and the wirings is not particularly limited.

By the steps described above, the surface-emitting type device 100 in accordance with the present embodiment can be obtained, as shown in FIG. 1 and FIG. 2.

1-3. According to the surface-emitting type device 100 in accordance with the present embodiment, even when a reverse bias voltage is impressed to the emission section 140, a current flows to the rectification section 120 that is connected in parallel with the emission section 140. By this, the electrostatic breakdown voltage of the surface-emitting type device 100 against a reverse bias voltage can be considerably improved. Accordingly, electrostatic destruction can be prevented in the mounting process or the like, such that its handling can be well facilitated, and its reliability can be improved.

Furthermore, according to the surface-emitting type device 100 and its manufacturing method in accordance with the present embodiment, the second contact layer 171 and the fourth semiconductor layer 111 can be formed by a common process, the photoabsorption layer 172 and the capacitance adjusting layer 112 can be formed by a common process, and the first contact layer 174 and the first semiconductor layer 114 can be formed by a common process. Accordingly, when the rectification section 120, the emission section 140 and the optical detection section 170 are formed on a common substrate, the manufacturing process can be simplified.

The photodetector section 170 in accordance with the present embodiment can monitor a part of light output of the emission section 140 that functions as a surface-emitting type semiconductor laser. In other words, the photodetector section 170 can function as a photodiode for monitoring the surface-emitting type semiconductor laser. By feeding back the monitored result to the drive circuit, changes in the output caused by changes in temperature or the like can be corrected, such that stable light output can be obtained.

2. Second Embodiment 2-1. Next, a surface-emitting type device 200 in accordance with a second embodiment is described. It is noted that features different from the surface-emitting type device 100 described above and shown in FIG. 1 and FIG. 2 are mainly described, and descriptions of similar features are omitted.

Figure 7:
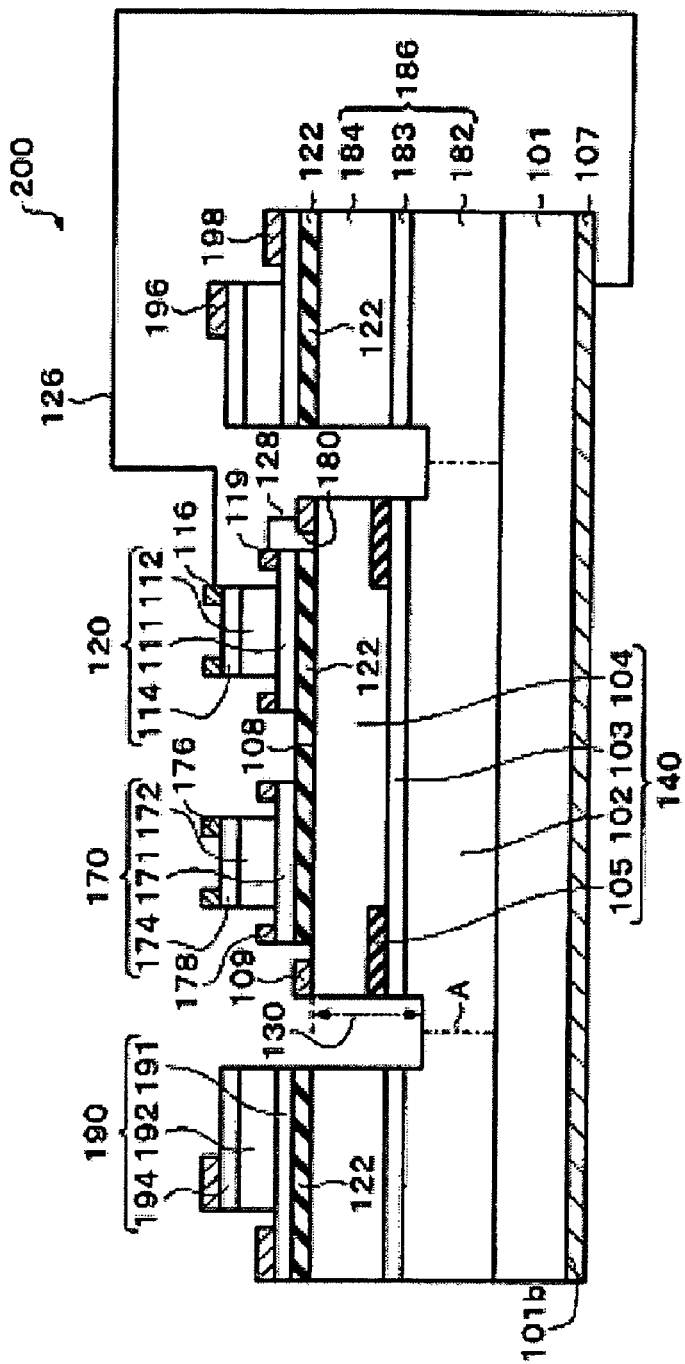
FIG. 7 is a cross-sectional view schematically showing a surface-emitting type device in accordance with a second embodiment of the invention.
Figure 8:
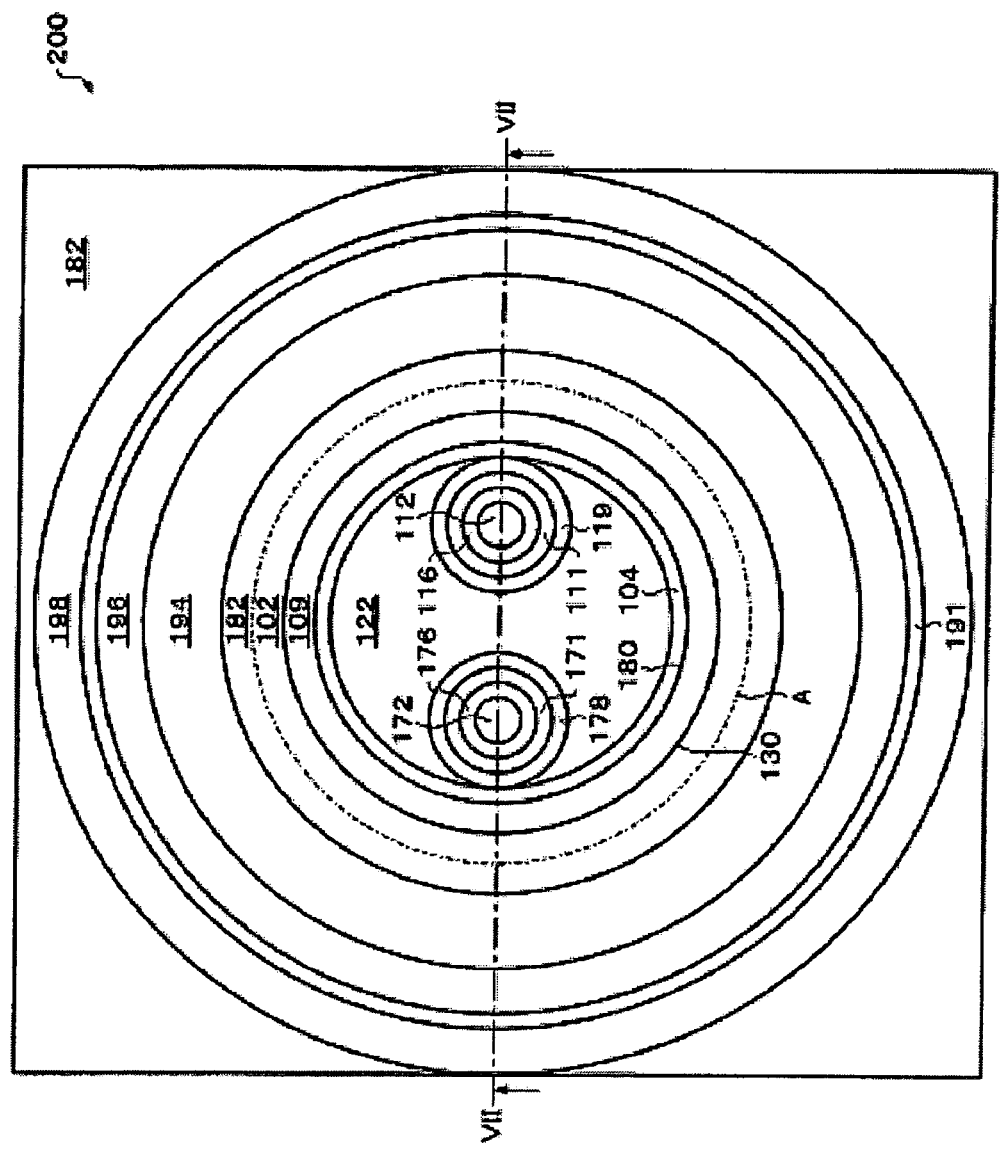
FIG. 8 is a plan view schematically showing the surface-emitting type device in accordance with the second embodiment of the invention.

FIG. 7 is a cross-sectional view taken along a line VIII-VIII of FIG. 8, and FIG. 8 is a plan view schematically showing the surface-emitting type device 200. It is noted that the same members as those of the surface-emitting type device 100 described above and shown in FIG. 1 and FIG. 2 are appended with the same reference numbers.

Figure 9:
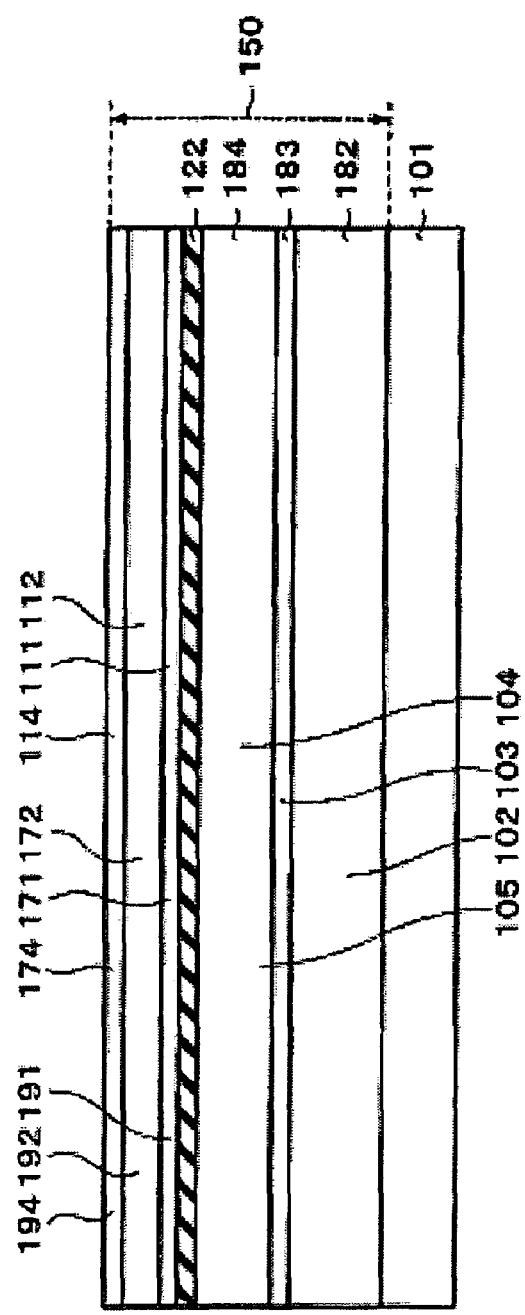
FIG. 9 is a cross-sectional view schematically showing a method for manufacturing the surface-emitting type device in accordance with the second embodiment.

The surface-emitting type device 200 includes a rectification section 120, an emission section 140, a photodetector section (hereafter referred to as a "first photodetector section") 170, and another photodetector section (hereafter referred to as a "second photodetector section"), as shown in FIG. 8 and FIG. 9. The present embodiment is described as to a case in which the rectification section 120 functions as a junction diode (including a Zener diode), the emission section 140 functions as a surface-emitting type semiconductor laser, and the first and second photodetector sections 170 and 190 function as photodiodes.

The substrate 101 supports the rectification section 120, the emission section 140 and the first and second optical detection sections 170 and 190. In other words, the rectification section 120, the emission section 140 and the first and second optical detection sections 170 and 190 are formed on a common substrate (the same chip), and form a monolithic structure. As the substrate 101, for example, a GaAs substrate of a first conductivity type (for example, n-type) can be used.

The emission section 140 and a support section 186 are formed over the substrate 101. The support section 186 includes a first support layer 182, a second support layer 183 formed above the first support layer 182 and a third support layer 184 formed above the second support layer 183. The first support layer 182 and the second semiconductor layer 102 are formed by a common process, the second support layer 183 and the active layer 103 are formed by a common process, and the third support layer 184 and the third semiconductor layer 104 are formed by a common process. In other words, the first support layer 182 is composed of semiconductor with the same composition as that of the second semiconductor layer 102, the second support layer 183 is composed of semiconductor with the same composition as that of the active layer 103, and the third support layer 184 is composed of semiconductor with the same composition as that of the third semiconductor layer 104. Furthermore, the distance between the substrate 101 and the support layer 183 is about the same as the distance between the substrate 101 and the active 103, and the distance between the substrate 101 and the third support layer 184 is about the same as the distance between the substrate 101 and the third semiconductor layer 104.

More concretely, the first support layer 182 is, for example, a DBR mirror of 40 pairs of alternately laminated n-type $Al_{0.9}Ga_{0.1}As$ layers and n-type $Al_{0.15}Ga_{0.85}As$ layers. The second support layer 183 has a multiple quantum well (MQW) structure in which quantum well structures each formed from, for example, a GaAs well layer and an $Al_{0.3}Ga_{0.7}As$ barrier layer are laminated in three layers. The third support layer 184 is, for example, a DBR mirror of 25 pairs of alternately laminated p-type $Al_{0.9}Ga_{0.1}As$ layers and p-type $Al_{0.15}Ga_{0.85}As$ layers. It is noted that a boundary line A between the first support layer 182 and the second semiconductor layer 102 shown in FIG. 7 and FIG. 8 can be, for convenience' sake, an intermediate line (see FIG. 8) between a fourth contact layer 194 and a third electrode 109 in a plan view.

For example, a second electrode 107 can be formed over the entire surface of a back surface 101b of the substrate 101. The second electrode 107 connects to the second semiconductor layer 102 through the substrate 101, and the third electrode 109 connects to the third semiconductor layer 104 on a first columnar section 130. A current is injected in the active layer 103 by the second electrode 107 and the third electrode 109.

The rectification section 120 and the first photodetector section 170 are formed over the emission section 140 through an isolation layer 122. In other words, the rectification section 120 and the first photodetector section 170 are formed vertically above at least a portion of the emission section 140. Further, the second photodetector section 190 is formed above the support section 186 through the isolation layer 122. In other words, the second photodetector section 190 is formed vertically above at least a portion of the support section 186. The second photodetector section 190 is electrically isolated from the emission section 140 by the isolation layer 122.

The second photodetector section 190 includes the substrate 101, a fifth contact layer 191 formed above the substrate 101, another photoabsorption layer (hereafter referred to as a "second photoabsorption layer") 192 formed above the fifth contact layer 191, and another contact layer (hereafter referred to as a "fourth contact layer") 194 formed above the second photoabsorption layer 192. The fifth contact layer 191 is formed by a common process conducted for forming the fourth semiconductor layer 111 and the second contact layer 171, the second photoabsorption layer 192 is formed by a common process conducted for forming the capacitor adjusting layer 112 and the photoabsorption layer (hereafter referred to as a "first photoabsorption layer") 172, and the fourth contact layer 194 is formed by a common process conducted for forming the first semiconductor layer 114 and the first contact layer 174. In other words, the fifth contact layer 191 is composed of semiconductor with the same composition as that of the fourth semiconductor layer 111, the second photoabsorption layer 192 is composed of semiconductor with the same composition as that of the capacitance adjusting layer 112, and the fourth contact layer 194 is composed of semiconductor with the same composition as that of the first semiconductor layer 114. Furthermore, the distance between the substrate 101 and the fifth contact layer 191 is about the same as the distance between the substrate 101 and the fourth semiconductor layer 111, the distance between the substrate 101 and the second photoabsorption layer 192 is about the same as the distance between the substrate 101 and the capacitor adjusting layer 112, and the distance between the substrate 101 and the fourth contact layer 194 is about the same as the distance between the substrate 101 and the first semiconductor layer 114.

More concretely, the fifth contact layer 191 may be composed of, for example, a GaAs layer of a first conductivity type (for example, n-type), the second photoabsorption layer 192 may be composed of, for example, a GaAs layer that is not doped with an impurity, and the fourth contact layer 194 may be composed of, for example, a GaAs layer of a second conductivity type (for example, p-type). Accordingly, the p-type fourth contact layer 194, the second photoabsorption layer 192 that is not doped with an impurity, and the n-type fifth contact layer 191 form a pin diode.

The fifth contact layer 191, the isolation layer 122, the third support layer 184, the second support layer 183 and a portion of the first support layer 182 form a columnar semiconductor deposited body. The columnar semiconductor deposited body has a plane configuration that is, for example, a ring shape surrounding the first columnar section 130. The fourth contact layer 194 and the second photoabsorption layer 192 form a columnar semiconductor deposited body. The columnar semiconductor deposited body has a plane configuration that is, for example, a ring shape. A side surface of the columnar semiconductor deposited body on its inner side is continuous with a side surface of the first contact layer 191 on its inner side.

A seventh electrode 196 is electrically connected to the fourth contact layer 194, and an eighth electrode 198 is electrically connected to the fifth contact layer 191. For example, the seventh electrode 196 is formed on the fourth contact layer 194 along its circumference. The seventh electrode 196 has a plane configuration that is, for example, a ring shape shown in FIG. 8. For example, the eighth electrode 198 is formed on the fifth contact layer 191. The eighth electrode 198 has a plane configuration that is, for example, a ring shape shown in FIG. 8. The seventh and eighth electrodes 196 and 198 are used to drive the second photodetector section 190.

2-2. Next, an example of a method for manufacturing the surface-emitting type device 200 in accordance with the present embodiment is described with reference to FIG. 7-FIG. 10. It is noted that features different from the method for manufacturing the surface-emitting type device 100 described above and shown in FIG. 1 and FIG. 2 are mainly described, and descriptions of similar features are omitted.

Figure 10:
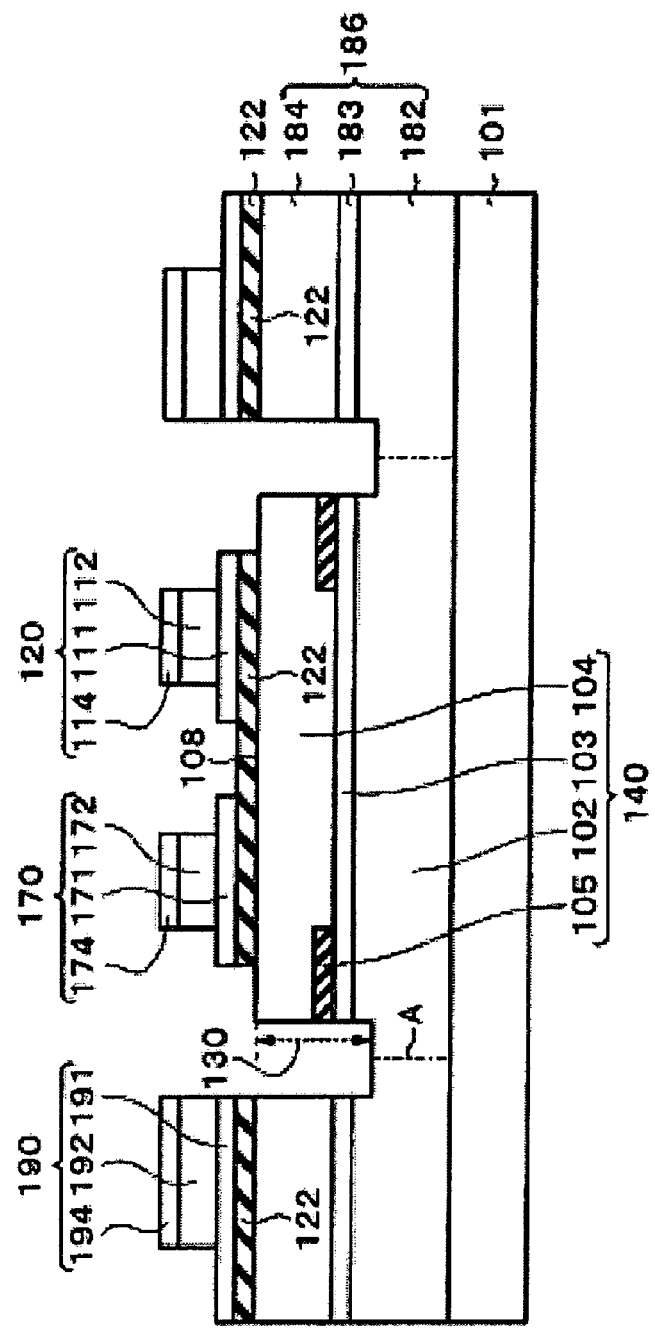
FIG. 10 is a cross-sectional view schematically showing the method for manufacturing the surface-emitting type device in accordance with the second embodiment.

FIG. 9 and FIG. 10 are cross-sectional views schematically showing a manufacturing process for manufacturing the surface-emitting type device 200 in accordance with the present embodiment shown in FIG. 7 and FIG. 8, and correspond to the cross-sectional view shown in FIG. 7, respectively.

(1) First, as shown in FIG. 9, for example, a GaAs substrate of a first conductivity type (for example, n-type) is prepared as a substrate 101.

Next, a semiconductor multilayer film 150 is formed on the substrate 101 by epitaxial growth while modifying its composition. The semiconductor multilayer film 150 is composed of successively laminated semiconductor layers that compose a second semiconductor layer 102 (first support layer 182), an active layer 103 (second support layer 183), a third semiconductor layer 104 (third support layer 184), an isolation layer 122, a fourth semiconductor layer 111 (second and fifth contact layers 171 and 191), a capacitor adjusting layer 112 (first and second photoabsorption layers 172 and 192), and a first semiconductor layer 114 (first and fourth contact layers 174 and 194). It is noted here that the semiconductor layer that composes the second semiconductor layer 102 is also the semiconductor layer that composes the first support layer 182, the semiconductor layer that composes the active layer 103 is also the semiconductor layer that composes the second support layer 183, the semiconductor layer that composes the third semiconductor layer 104 is also the semiconductor layer that composes the third support layer 184, the semiconductor layer that composes the fourth semiconductor layer 111 is also the semiconductor layer that composes the second and fifth contact layers 171 and 191, the semiconductor layer that composes the capacitance adjusting layer 112 is also the semiconductor layer that composes the first and second photoabsorption layers 172 and 192, and the semiconductor layer that composes the first semiconductor layer 114 is also the semiconductor layer that composes the first and fourth contact layers 174 and 194.

(2) Next, the semiconductor multilayer film 150 is patterned to form the second semiconductor layer 102 (first support layer 182), the active layer 103 (second support layer 183), the third semiconductor layer 104 (third support layer 184), the isolation layer 122, the fourth semiconductor layer 111 (second and fifth contact layers 171 and 191), the capacitance adjusting layer 112 (first and second photoabsorption layers 172 and 192), and the first semiconductor layer 114 (first and fourth contact layers 174 and 194). It is noted here that the second semiconductor layer 102 and the first support layer 182 can be formed by the same patterning step, the active layer 103 and the second support layer 183 can be formed by the same patterning step, the third semiconductor layer 104 and the third support layer 184 can be formed by the same patterning step, the fourth semiconductor layer 111, the second contact layer 171 and the fifth contact layer 191 can be formed by the same patterning step, the capacitance adjusting layer 112, the first photoabsorption layer 172 and the second photoabsorption layer 192 can be formed by the same patterning step, and the first semiconductor layer 114, the first contact layer 174 and the fourth contact layer 194 can be formed by the same patterning step. Next, as shown in FIG. 10, an oxidized constricting layer 105 is formed.

(3) Next, as shown in FIG. 7 and FIG. 8, first-eighth electrodes 116, 107, 109, 119, 176, 178, 196 and 198, and first and second wirings 126 and 128 are formed. As the seventh electrode 196, for example, a laminated film of an alloy of gold (Au) and zinc (Zn), and gold (Au) can be used. As the eighth electrode 198, for example, a laminated film of an alloy of gold (Au) and germanium (Ge), nickel (Ni) and gold (Au) can be used.

By the steps described above, the surface-emitting type device 200 in accordance with the present embodiment shown in FIG. 7 and FIG. 8 can be obtained.

2-3. The surface-emitting type device 200 in accordance with the present embodiment has substantially the same actions and effects as the actions and effects of the first embodiment described above.

Also, according to the surface-emitting type device 200 and its manufacturing method in accordance with the present embodiment, the fifth contact layer 191 can be formed by a common process conducted for forming the fourth semiconductor layer 111 and the second contact layer 171, the second photoabsorption layer 192 can be formed by a common process conducted for forming the capacitance adjusting layer 112 and the first photoabsorption layer 172, and the fourth contact layer 194 can be formed by a common process conducted for forming the first semiconductor layer 114 and the first contact layer 174. Accordingly, when the rectification section 120, the emission section 140, and the first and second photodetector sections 170 and 190 are formed on a common substrate, the manufacturing process can be simplified. In other words, according to the surface-emitting type device 200 and its manufacturing method in accordance with the present embodiment, the rectification section 120, the emission section 140 and the first and second photodetector sections 170 and 190 can be readily integrated on a common substrate.

Also, the second photodetector section 190 in accordance with the present embodiment can function as a photodiode for reception in two-way optical communications. According to the surface-emitting type device 200 and its manufacturing method in accordance with the present embodiment, the emission section 140 for transmission and the second photodetector section 190 for reception in two-way optical communications can be readily integrated on a common substrate. Also, according to the surface-emitting type device 200 in accordance with the present embodiment, because the emission section 140 for transmission and the second photodetector section 190 for reception in two-way optical communications are formed on a common substrate, an alignment step for alignment with an optical waveguide (for example, an optical fiber or the like) that is used for optical communications can be simplified. As a result, the manufacturing cost can be reduced.

Although the embodiments of the invention are described above in detail, it should be readily understood by a person having ordinary skill in the art that many modifications can be made without departing in substance from the novelty and effects of the invention. Accordingly, such modified examples should be included in the scope of the invention.

For example, in the surface-emitting type devices 100 and 200 in accordance with the embodiments described above, the description is made as to the case where one first columnar section 130 is provided in the emission section 140. However, the mode of the invention shall not be harmed even when a plurality of first columnar sections 130 are provided in the emission section 140, or when the first columnar section 130 is not formed in the step of patterning the semiconductor multilayer film 150. Also, when a plurality of surface-emitting type devices 100 or 200 are formed in an array, similar actions and effects shall be exhibited. Furthermore, it should be noted that, for example, interchanging the p-type and n-type characteristics of each of the semiconductor layers in the above described embodiments does not deviate from the subject matter of the invention.

What is claimed is:

1. A surface-emitting type device, comprising:
   a substrate including a first portion, a second portion and a third portion, the second portion being positioned between the first portion and the third portion;
   a photo detection element formed above the first portion, the photo detection element including a photo absorption layer;
   a light emission element formed above the photo detection element, the light emission element including an active layer, and a first electrode formed above the active layer, the first electrode having an opening section that defines a light emission surface; and
   a rectification element formed above the third portion, the rectification element including a capacitance adjusting layer, the rectification element being electrically connected to the light emission element.

2. The surface-emitting type device according to claim 1, the photo detection element further including:
   a first contact layer formed between the photo absorption layer and the first portion of the substrate; and
   a second electrode formed on a part of the first contact layer.

3. The surface-emitting type device according to claim 1, the second portion being an element isolation region that electrically isolates the photo detection element, the photo absorption element, and the rectification element respectively.

4. The surface-emitting type device according to claim 1, the substrate having an insulating property.

5. The surface-emitting type device according to claim 1, further comprising
   an isolating layer formed between the photo detection element and the light emitting element.

6. The surface-emitting type device according to claim 1, the photo detection element further including a second contact layer formed on the photo absorption layer, and a third electrode formed on a part of the second contact layer.

7. The surface-emitting type device according to claim 5, the light emission element further including a third contact layer, the third contact layer sandwiching the isolating layer with the second contact layer; and
   a fourth electrode formed on a part of the third contact layer, the fourth electrode having a ring shape in a plan view.

8. The surface-emitting type device according to claim 1, the rectification element further including a first semiconductor layer formed above the third portion of the substrate, a second semiconductor layer formed above the capacitance adjusting layer, a fifth electrode formed above the second semiconductor layer, and a sixth electrode formed on a part of the first semiconductor layer, the fifth electrode being electrically connected to the fourth electrode by a first wiring and the sixth electrode being electrically connected to the first electrode by a second wiring.

9. The surface-emitting type device according to claim 1, the first contact layer and the first semiconductor layer including the same material.

10. The surface-emitting type device according to claim 1, the photo absorption layer and the capacitance adjusting layer including the same material.

11. The surface-emitting type device according to claim 1, the light emitting element being formed inside the photo detecting element in a plan view.

12. A surface-emitting type device, comprising:
    a substrate including a first portion, a second portion and a third portion, the second portion being positioned between the first portion and the third portion;
    a photo detection element formed above the first portion, the photo detection element including:
      a photo absorption layer and a first electrode formed above the photo absorption layer;
      an isolation layer formed above the photo detection element;
    a light emission element formed above the isolation layer, the light emission element including a first contact layer formed on the isolation layer, a first semiconductor layer formed above the first contact layer, and a second electrode formed above the first semiconductor layer, the second electrode defining a light emission surface;

a rectification element formed above the third portion, the rectification element including a second semiconductor layer formed above the third portion of the substrate, a third electrode formed on a part of the second semiconductor layer, a capacitance adjusting layer formed on another part of the second semiconductor layer, and a fourth electrode formed above the capacitance adjusting layer, the second electrode being electrically connected to the third electrode by a first wiring.

13. The surface-emitting type device according to claim 12, the light emission element further including a fifth electrode formed above the first contact layer, the fifth electrode and the fourth electrode being electrically connected by a second wiring.

14. The surface-emitting type device according to claim 12, the second portion being an element isolation region that electrically isolates the photo detection element, the photo absorption element, and the rectification element respectively.

15. A surface-emitting type device, comprising:
a substrate including a first portion, a second portion, and a third portion, the second portion being positioned between the first portion and the third portion;
a photo detection element formed above the first portion, the photo detection element including a first semiconductor layer and a first electrode formed on a part of the semiconductor layer, the first electrode being electrically connected to the first semiconductor layer;
an isolation layer formed above the photo detection element;
a light emitting element formed above the isolation layer, the light emitting element including a second semiconductor layer formed above the isolation layer and a second electrode formed on the second semiconductor layer, the second electrode being electrically connected to the second semiconductor layer; a third semiconductor layer formed above the second electrode, and a third electrode formed on the third semiconductor layer, the third electrode defining a light emission surface; and a rectification element formed on a third portion of the substrate, the rectification element including a fourth semiconductor layer formed above the substrate, a fourth electrode formed on the fourth semiconductor layer, the fourth electrode being electrically connected to the fourth semiconductor layer, a fifth semiconductor layer formed above the fourth semiconductor layer, and a fifth electrode formed on the fifth semiconductor layer, the third electrode and the fourth electrode being electrically connected.

16. The surface-emitting type device according to claim 15, the photo detecting element further including a fifth semiconductor layer and a photo absorption layer formed above the fifth semiconductor layer, the fifth semiconductor layer and the photo absorption layer being positioned between the first semiconductor layer and the substrate.

17. The surface-emitting type device according to claim 16, the fifth semiconductor layer having a first conductivity type, and the first semiconductor layer having a second conductivity type.

18. The surface-emitting type device according to claim 15, the light emitting element further including a sixth semiconductor layer, an active layer formed above the sixth semiconductor layer, the sixth semiconductor layer and the active layer being positioned between the second semiconductor layer and the third semiconductor layer.

19. The surface-emitting type device according to claim 15, the rectification element further including a capacitance adjusting layer formed between the fourth semiconductor layer and the fifth electrode.

20. The surface-emitting type device according to claim 15, the second electrode being electrically connected to the fifth electrode.

21. The surface-emitting type device according to claim 15, the fifth electrode being surrounded by the fourth electrode.

22. The surface-emitting type device according to claim 18, the sixth semiconductor layer having a first conductivity type and the third semiconductor layer having a second conductivity type.

* * * * *